United States Patent
Ziazadeh et al.

(10) Patent No.: US 6,657,489 B1
(45) Date of Patent: Dec. 2, 2003

(54) OPERATIONAL AMPLIFIER CIRCUIT WITH IMPROVED FEEDBACK FACTOR

(75) Inventors: Ramsin Ziazadeh, San Jose, CA (US); Jitendra Mohan, Santa Clara, CA (US); Abu-Hena M. Kamal, Santa Clara, CA (US); Devnath Varadarajan, Santa Clara, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/029,121

(22) Filed: Dec. 21, 2001

(51) Int. Cl.[7] ............................................. H03F 3/45
(52) U.S. Cl. ........................................ 330/69; 330/144
(58) Field of Search ........................ 330/69, 75, 144, 330/147, 150, 302, 311

(56) References Cited

U.S. PATENT DOCUMENTS 3,898,580 A * 8/1975 Millsap ................. 330/144 X
4,070,632 A * 1/1978 Tuttle ..................... 330/144 X
6,340,916 B1 * 1/2002 Chen et al. ................... 330/69

* cited by examiner

Primary Examiner—Steven J. Mottola

(57) ABSTRACT

An operational amplifier circuit with improved feedback factor is provided that includes an input impedance, an operational amplifier, and a current conveyor. The input impedance is operable to receive an input signal. The operational amplifier comprises an inverting input node, a non-inverting input node, and an output node. The operational amplifier is operable to generate an output signal at the output node based on the input signal. The current conveyor is coupled between the input impedance and the inverting input node of the operational amplifier. The current conveyor is operable to provide a low impedance to the input impedance and a high impedance to the operational amplifier.

20 Claims, 1 Drawing Sheet

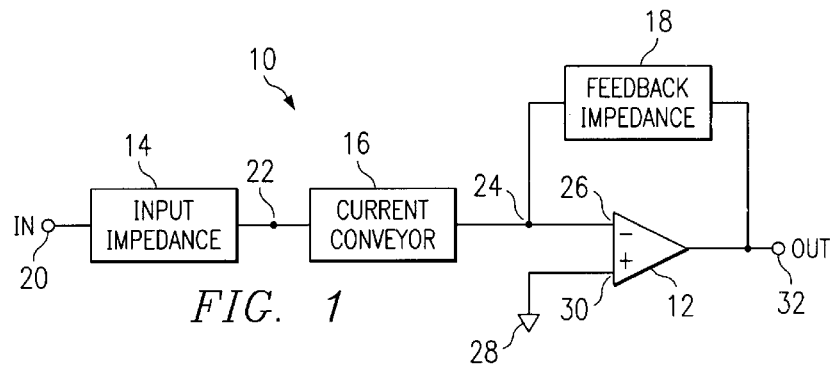
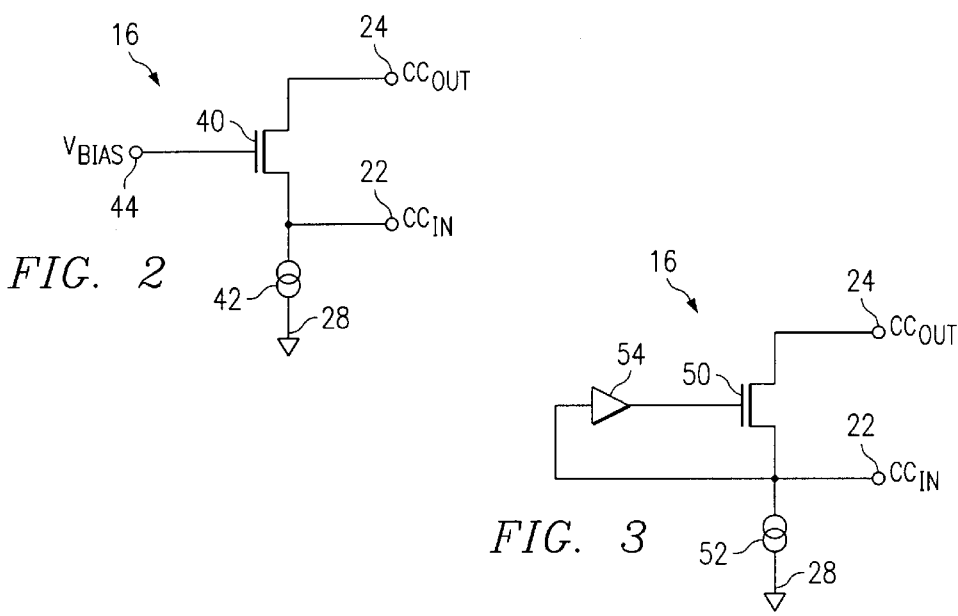
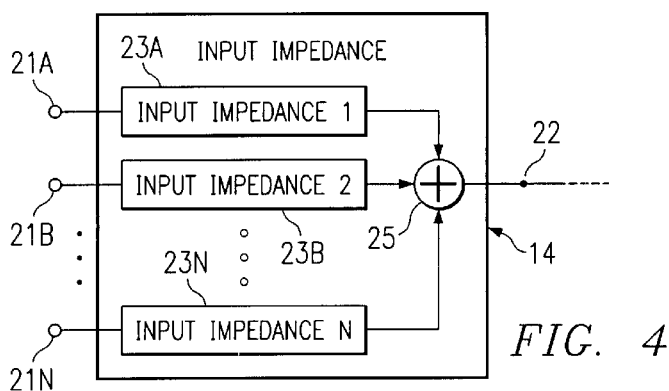

OPERATIONAL AMPLIFIER CIRCUIT WITH IMPROVED FEEDBACK FACTOR

TECHNICAL FIELD OF THE INVENTION

The present invention is directed, in general, to operational amplifiers and, more specifically, to an operational amplifier circuit with improved feedback factor.

BACKGROUND OF THE INVENTION

Many analog circuit blocks, such as amplifiers, equalizers, control loops, and the like, extensively use operational amplifiers (op-amps) designed with large open-loop gains. The use of op-amps with negative feedback generally simplifies design due to many desirable traits exhibited by negative feedback systems, including insensitivity to variations in DC gain, increased linearity, improved power supply rejection ratio, and the like.

However, when such systems are used in configurations in which the op-amp has to gain up the input signal, only a fraction of the open-loop gain is available to provide the benefits of a negative feedback closed-loop system. The ratio of available gain to open-loop gain, which is called the feedback factor, is an important issue in the design of the op-amp, as well as the design of the overall circuit block.

To simplify the design of the op-amp and to reduce overall power consumption, the op-amp circuits are generally designed with a feedback factor as close to unity as possible. However, in conventional systems, the feedback factor is typically limited to less than unity because of the op-amp having to gain up the input signal. Thus, op-amp circuits having a low feedback factor result in higher power consumption, greater area requirements, higher capacitance on op-amp inputs, which causes attenuation in the feedback factor at relatively high frequencies, and other disadvantages as compared to op-amp circuits having a feedback factor closer to unity.

SUMMARY OF THE INVENTION

In accordance with the present invention, an operational amplifier circuit with improved feedback factor is provided that substantially eliminate or reduce disadvantages and problems associated with conventional systems. In particular, a current conveyor is included as part of the operational amplifier circuit, which allows a feedback factor that is close to unity while still providing large signal path gains.

According to one embodiment of the present invention, an operational amplifier circuit with improved feedback factor is provided that includes an input impedance, an operational amplifier, and a current conveyor. The input impedance is operable to receive an input signal. The operational amplifier comprises an inverting input node, a non-inverting input node, and an output node. The operational amplifier is operable to generate an output signal at the output node based on the input signal. The current conveyor is coupled between the input impedance and the inverting input node of the operational amplifier. The current conveyor is operable to provide a low impedance to the input impedance and a high impedance to the operational amplifier.

Technical advantages of one or more embodiments of the present invention include providing an improved operational amplifier circuit. In a particular embodiment, a current conveyor is used to isolate an operational amplifier from its input network. As a result, the gain factor for the operational amplifier circuit remains unaffected, while the feedback factor for the operational amplifier remains close to unity irrespective of the gain factor. Accordingly, an operational amplifier circuit is provided with a feedback factor close to unity, as well as with reduced power consumption, decreased area requirements, and lower capacitance on inputs to the operational amplifier.

Other technical advantages will be readily apparent to one skilled in the art from the following figures, description, and claims.

Before undertaking the DETAILED DESCRIPTION OF THE INVENTION, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present invention and its advantages, reference is now made to the following description taken in conjunction with the accompanying drawings, wherein like reference numerals represent like parts, in which:

FIG. 1 is a block diagram illustrating an operational amplifier circuit with improved feedback factor in accordance with one embodiment of the present invention;

FIG. 2 is a circuit diagram illustrating the current conveyor of FIG. 1 in accordance with one embodiment of the present invention;

FIG. 3 is a circuit diagram illustrating the current conveyor of FIG. 1 in accordance with another embodiment of the present invention; and FIG. 4 is a circuit diagram illustrating a plurality of input signals and a plurality of input impedances in accordance with another embodiment of the present invention.

DETAILED DESCRIPTION OF THE INVENTION

FIGS. 1 through 4, discussed below, and the various embodiments used to describe the principles of the present invention in this patent document are by way of illustration only and should not be construed in any way to limit the scope of the invention. Those skilled in the art will understand that the principles of the present invention may be implemented in any suitably arranged operational amplifier circuit.

FIG. 1 is a block diagram illustrating an operational amplifier circuit 10 with improved feedback factor in accordance with one embodiment of the present invention. The operational amplifier circuit 10 comprises an operational amplifier (op-amp) 12, an input impedance 14, a current conveyor 16, and a feedback impedance 18.

The input impedance 14 is coupled to an input node 20 and is operable to receive an input signal from the input node 20. The input impedance is also coupled to the current conveyor 16 through a current conveyor input node 22. Although the embodiment illustrated in FIG. 1 includes a single input impedance 14 coupled to a single input node 20, it will be understood that the input impedance 14 may comprise a summation of a plurality of input impedances, each having a corresponding input signal.

A summation of a plurality of input impedances, each having a corresponding input signal, is shown in FIG. 4. A first input impedance 23A is coupled to a first input node 21A and is operable to receive a first input signal from the first input node 21A. Similarly, a second input impedance 23B is coupled to a second input node 21B and is operable to receive a second input signal from the second input node 21B. An nth input impedance 23N is coupled to an nth input node 21N and is operable to receive an nth input signal from the nth input node 21N. The plurality of input impedances, 23A to 23N, are summed in adder unit 25 and the summation of the plurality of input impedances is output to current conveyor input node 22. output node 24. As such, the current conveyor 16 is operable to provide a relatively low impedance from the perspective of the input impedance 14 and a relatively high impedance from the perspective of the op-amp 12 and the feedback impedance 18.

The op-amp 12 is operable to receive the current conveyor output signal from the current conveyor output node 24 at an inverting input node 26 of the op-amp 12 and to receive a ground signal 28 at a non-inverting input node 30 of the op-amp 12. The op-amp 12 is also operable to generate an output signal at an output node 32 for the operational amplifier circuit 10 based on the signals at the input nodes 26 and 30.

The feedback impedance 18 is operable to provide a feedback loop between the output node 32 and the non-inverting input node 26 of the op-amp 12. Based on a feedback factor related to the feedback impedance 18 and the current conveyor 16 and based on a gain factor for the operational amplifier circuit 10, the input signal received at the input node 20 is amplified to generate the output signal at the output node 32.

In operation, an input signal is received at the input node 20 and applied to the input impedance 14, which results in a current conveyor input signal at the current conveyor input node 22. The current conveyor 16 conveys the current from the current conveyor input node 22 to the current conveyor output node 24.

The current conveyor output signal at the current conveyor output node 24 is applied to the inverting input node 26 of the op-amp 12 and to the feedback impedance 18. The ground signal 28 is applied to the non-inverting input node 30 of the op-amp 12. The op-amp 12 generates an output signal at the output node 32.

The output signal generated by the op-amp 12 is based on the difference between the signals at the input nodes 26 and 30, in addition to a gain factor and a feedback factor for the operational amplifier circuit 10. Thus, for the illustrated embodiment, the output signal may be determined by multiplying the input signal by the gain factor and the feedback factor.

The feedback factor may be determined by the following formula:

$$FF = R_{cc}/(R_{cc} + R_{FI}),$$

where FF is the feedback factor, $R_{cc}$ is the resistance associated with the current conveyor 16 from the perspective of the op-amp 12, and $R_{FI}$ is the resistance associated with the feedback impedance 18. Thus, because $R_{cc}$ is extremely large relative to $R_{FI}$, the feedback factor is approximately unity.

The gain factor for the operational amplifier circuit 10 may be determined by dividing the amount of resistance provided by the feedback impedance 18 by the amount of resistance provided by the input impedance 14. Thus, the gain factor remains unaffected by the current conveyor 16.

FIG. 2 is a circuit diagram illustrating the current conveyor 16 in accordance with one embodiment of the present invention. The current conveyor 16 comprises an n-type transistor 40, a current source 42, and a bias voltage node 44 operable to receive a bias voltage.

The drain of the transistor 40 is coupled to the current conveyor output node 24, the gate of the transistor 40 is coupled to the bias voltage node 44, and the source of the transistor 40 is coupled to the current conveyor input node 22 and the current source 42. The current source 42 is also coupled to ground 28.

For the embodiment illustrated in FIG. 2, the current conveyor 16 is operable to provide an impedance equivalent to the transconductance parameter, $g_m$, for the transistor 40 from the perspective of the input impedance 14 and to provide a resistance of about $R_o$, which is the output impedance of the current source 42, from the perspective of the op-amp 12 and the feedback impedance 18.

In operation, the current source 42 provides a specified current through the transistor 40. The current conveyor input node 22 receives an additional current from the input impedance 14. This additional current is provided through the transistor 40 to the current conveyor output node 24. Thus, the current from the input impedance 14 is passed through the current conveyor 16 to the op-amp 12 and the feedback impedance 18. In addition, because of the relatively large impedance seen by the op-amp 12 at the current conveyor output node 24, the feedback factor remains close to unity.

FIG. 3 is a circuit diagram illustrating the current conveyor 16 in accordance with another embodiment of the present invention. The current conveyor 16 comprises an n-type transistor 50, a current source 52, and a secondary amplifier 54.

The drain of the transistor 50 is coupled to the current conveyor output node 24, the gate of the transistor 50 is coupled to the secondary amplifier 54, and the source of the transistor 50 is coupled to the current conveyor input node 22, the current source 52, and the secondary amplifier 54. The current source 52 is also coupled to ground 28.

For the embodiment illustrated in FIG. 3, the current conveyor 16 is operable to provide an input impedance equivalent to $1/(g_m * A)$, where A is the amplification factor for the secondary amplifier 54, from the perspective of the input impedance 14 and to provide $A * R_o$ of resistance from the perspective of the op-amp 12 and the feedback impedance 18.

In operation, the current source 42 provides a specified current through the transistor 50. The current conveyor input node 22 receives an additional current from the input impedance 14. This additional current is provided through the transistor 50 to the current conveyor output node 24. Thus, the current from the input impedance 14 is passed through the current conveyor 16 to the op-amp 12 and the feedback impedance 18. In addition, because of the relatively large impedance seen by the op-amp 12 at the current conveyor output node 24, the feedback factor remains close to unity.

Furthermore, as described above, the use of a secondary amplifier 54 results in a reduction in the impedance of the current conveyor 16 from the perspective of the input impedance 14 and an increase in the impedance of the current conveyor 16 from the perspective of the op-amp 12 and the feedback impedance 18. This arrangement thus improves the feedback factor and makes the operational amplifier circuit 10 less sensitive to variations.

Although the present invention has been described with several embodiments, various changes and modifications may be suggested to one skilled in the art. It is intended that the present invention encompass such changes and modifications as fall within the scope of the appended claims.

What is claimed is:

1. An operational amplifier circuit with improved feedback factor, comprising:
   an input impedance operable to receive an input signal;
   an operational amplifier comprising an inverting input node, a non-inverting input node, and an output node, the operational amplifier operable to generate an output signal at the output node based on the input signal; and
   a current conveyor coupled between the input impedance and the inverting input node of the operational amplifier, the current conveyor operable to provide a low impedance to the input impedance and a high impedance to the operational amplifier.

2. The operational amplifier circuit of claim 1, further comprising a feedback impedance coupled to the output node of the operational amplifier and to the inverting input node of the operational amplifier.

3. The operational amplifier circuit of claim 1, the non-inverting input node of the operational amplifier coupled to ground.

4. The operational amplifier circuit of claim 1, the input impedance comprising a summation of a plurality of input impedances, each of the plurality of input impedances having a corresponding input signal.

5. An operational amplifier circuit with improved feedback factor, comprising:
   an input impedance operable to receive an input signal;
   an operational amplifier comprising an inverting input node, a non-inverting input node, and an output node, the operational amplifier operable to generate an output signal at the output node based on the input signal; and
   a current conveyor comprising an n-type transistor, the current conveyor coupled between the input impedance and the inverting input node of the operational amplifier, the current conveyor operable to provide a low impedance to the input impedance and a high impedance to the operational amplifier.

6. The operational amplifier circuit of claim 5, the input impedance coupled to the current conveyor through a source for the n-type transistor.

7. The operational amplifier circuit of claim 6, the current conveyor further comprising a bias voltage node coupled to a gate for the n-type transistor and operable to receive a bias voltage.

8. The operational amplifier circuit of claim 7, the current conveyor further comprising a current source coupled to the source for the n-type transistor.

9. The operational amplifier circuit of claim 8, the current conveyor coupled to the inverting input node of the operational amplifier through a drain for the n-type transistor.

10. The operational amplifier circuit of claim 5, further comprising a feedback impedance coupled to the output node of the operational amplifier and to the inverting input node of the operational amplifier.

11. The operational amplifier circuit of claim 5, the non-inverting input node of the operational amplifier coupled to ground.

12. The operational amplifier circuit of claim 5, the input impedance comprising a summation of a plurality of input impedances, each of the plurality of input impedances having a corresponding input signal.

13. An operational amplifier circuit with improved feedback factor, comprising:
    an input impedance operable to receive an input signal;
    an operational amplifier comprising an inverting input node, a non-inverting input node, and an output node, the operational amplifier operable to generate an output signal at the output node based on the input signal; and
    a current conveyor comprising an n-type transistor and a secondary amplifier, the current conveyor coupled between the input impedance and the inverting input node of the operational amplifier, the current conveyor operable to provide a low impedance to the input impedance and a high impedance to the operational amplifier.

14. The operational amplifier circuit of claim 13, the secondary amplifier coupled to a gate and a source for the n-type transistor.

15. The operational amplifier circuit of claim 14, the input impedance coupled to the current conveyor through the source for the n-type transistor.

16. The operational amplifier circuit of claim 15, the current conveyor further comprising a bias voltage node coupled to the gate for the n-type transistor and operable to receive a bias voltage.

17. The operational amplifier circuit of claim 16, the current conveyor further comprising a current source coupled to the source for the n-type transistor.

18. The operational amplifier circuit of claim 17, the current conveyor coupled to the inverting input node of the operational amplifier through a drain for the n-type transistor.

19. The operational amplifier circuit of claim 13, further comprising a feedback impedance coupled to the output node of the operational amplifier and to the inverting input node of the operational amplifier.

20. The operational amplifier circuit of claim 13, the non-inverting input node of the operational amplifier coupled to ground.

* * * * *

UNITED STATES PATENT AND TRADEMARK OFFICE
CERTIFICATE OF CORRECTION

PATENT NO.    : 6,657,489 B1
DATED         : December 2, 2003
INVENTOR(S)   : Ramsin Ziazadeh et al.

Page 1 of 1

It is certified that error appears in the above-identified patent and that said Letters Patent is hereby corrected as shown below:

<u>Column 3,</u>
Line 25, before the terms "output node 24." insert -- The current conveyor 16 is operable to convey the current from the current conveyor input node 22 to the current conveyor --.

Signed and Sealed this

Fifteenth Day of November, 2005

JON W. DUDAS
*Director of the United States Patent and Trademark Office*